US012751248B2

(12) United States Patent
Fukada

(10) Patent No.: US 12,751,248 B2
(45) Date of Patent: Sep. 29, 2026

(54) ELECTROSTATIC CHUCK HAVING EXTENDED LIFETIME

(71) Applicant: Applied Materials, Inc., Santa Clara, CA (US)

(72) Inventor: Mitsutoshi Fukada, Tokyo (JP)

(73) Assignee: Applied Materials Inc., Santa Clara, CA (US)

( * ) Notice: Subject to any disclaimer, the term of this patent is extended or adjusted under 35 U.S.C. 154(b) by 620 days.

(21) Appl. No.: 18/103,600

(22) Filed: Jan. 31, 2023

(65) Prior Publication Data

US 2024/0258940 A1 Aug. 1, 2024

(51) Int. Cl.

*H10P 72/72* (2026.01)
*H10P 72/76* (2026.01)
*H01J 37/02* (2006.01)
*H01J 37/32* (2006.01)

(52) U.S. Cl.

CPC ........ *H10P 72/722* (2026.01); *H10P 72/7612* (2026.01); *H10P 72/7614* (2026.01); *H10P 72/7624* (2026.01); *H01J 37/32715* (2013.01); *H01J 37/32724* (2013.01); *H01J 2237/002* (2013.01); *H01J 2237/006* (2013.01); *H01J 2237/0203* (2013.01); *H01J 2237/026* (2013.01); *H01J 2237/16* (2013.01); *H01J 2237/2007* (2013.01); *H01J 2237/32* (2013.01); *Y10T 279/23* (2015.01)

(58) Field of Classification Search

CPC ............... Y10T 279/23; H01L 21/6831; H01L 21/6833; H01L 21/68785; H01L 21/6875; H01L 23/467; H10P 72/72; H10P 72/722; H10P 72/7614; H10P 72/7624; H10P 72/70

USPC ........................................................ 279/128

See application file for complete search history.

(56) References Cited

U.S. PATENT DOCUMENTS

| | | | | |
|---|---|---|---|---|
| 10,510,575 | B2 | 12/2019 | Kraus et al. | |
| 2002/0159217 | A1* | 10/2002 | Tsuruta | H01L 21/6833 279/128 |
| 2012/0320491 | A1 | 12/2012 | Doh | |
| 2021/0005494 | A1 | 1/2021 | Matyushkin et al. | |
| 2021/0074569 | A1 | 3/2021 | Margavio et al. | |
| 2021/0104384 | A1 | 4/2021 | Parkhe | |
| 2021/0175086 | A1 | 6/2021 | Abhinand et al. | |
| 2022/0344193 | A1 | 10/2022 | Chen et al. | |
| 2022/0406576 | A1* | 12/2022 | Otsuki | H01L 21/6875 |

OTHER PUBLICATIONS

PCT International Search Report for PCT/US2024/012025 dated May 21, 2024.

* cited by examiner

*Primary Examiner* — Erica E Cadugan
(74) *Attorney, Agent, or Firm* — Moser Taboada

(57) ABSTRACT

Embodiments of substrate supports for use in process chambers are provided herein. In some embodiments, a substrate support includes: an electrostatic chuck (ESC) having an upper surface and a plurality of mesas extending upward from the upper surface and a plurality of trenches extending downward from the upper surface and into the ESC, wherein the ESC includes a plurality of backside gas openings extending through the ESC and terminating within at least some of the plurality of trenches; and one or more chucking electrodes disposed in the ESC.

19 Claims, 3 Drawing Sheets

ELECTROSTATIC CHUCK HAVING EXTENDED LIFETIME

FIELD

Embodiments of the present disclosure generally relate to substrate processing equipment.

BACKGROUND

In the processing of substrates, such as semiconductor substrates and displays, the substrate is held on a substrate support surface in a processing chamber during processing. The substrate support surface may include an electrostatic chuck (ESC) having one or more electrodes that can be electrically biased to hold a substrate to the substrate support surface. Some ESC designs include two or more electrodes that are charged to different voltages to create a charge separation in a substrate supported on the ESC. Electrostatic chucking forces are generated by charge separation induced in the substrate by the ESC, wherein oppositely charged electrodes are disposed in the ESC, thereby securing the substrate to a substrate support surface of the substrate support.

An upper surface of the ESC may have protrusions, or mesas, that form the substrate support surface. The mesas separate a back side of the substrate from the upper surface of the ESC so that backside cooling gas may be delivered to the substrate. After numerous processes, the mesas may gradually erode due to exposure to processing chemicals and friction with the substrates. The erosion of the mesas may lead to the substrate partially or completely covering certain backside cooling gas holes, interfering with uniform backside cooling gas distribution. The plugging of backside cooling gas holes causes the lack of uniform cooling of the substrate and lead to process shift. Accordingly, the inventors have provided herein embodiments of improved substrate supports.

SUMMARY

Embodiments of substrate supports for use in process chambers are provided herein. In some embodiments, a substrate support includes: an electrostatic chuck (ESC) having an upper surface and a plurality of mesas extending upward from the upper surface and a plurality of trenches extending downward from the upper surface and into the ESC, wherein the ESC includes a plurality of backside gas openings extending through the ESC and terminating within at least some of the plurality of trenches; and one or more chucking electrodes disposed in the ESC.

In some embodiments, a substrate support includes: an electrostatic chuck (ESC) having an upper surface and a plurality of mesas extending upward from the upper surface and a plurality of trenches extending downward from the upper surface and into the ESC between the plurality of mesas, wherein the ESC includes a plurality of backside gas openings extending through the ESC along two or more rings and terminating within at least some of the plurality of trenches; and one or more chucking electrodes disposed in the ESC.

In some embodiments, a process chamber includes: a chamber body defining an interior volume therein; and a substrate support disposed in the interior volume, the substrate support comprising: an electrostatic chuck (ESC) having an upper surface and a plurality of mesas extending upward from the upper surface and a plurality of trenches extending downward from the upper surface and into the ESC, wherein the ESC includes a plurality of backside gas openings extending through the ESC and terminating within at least some of the plurality of trenches, and one or more chucking electrodes disposed in the ESC.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
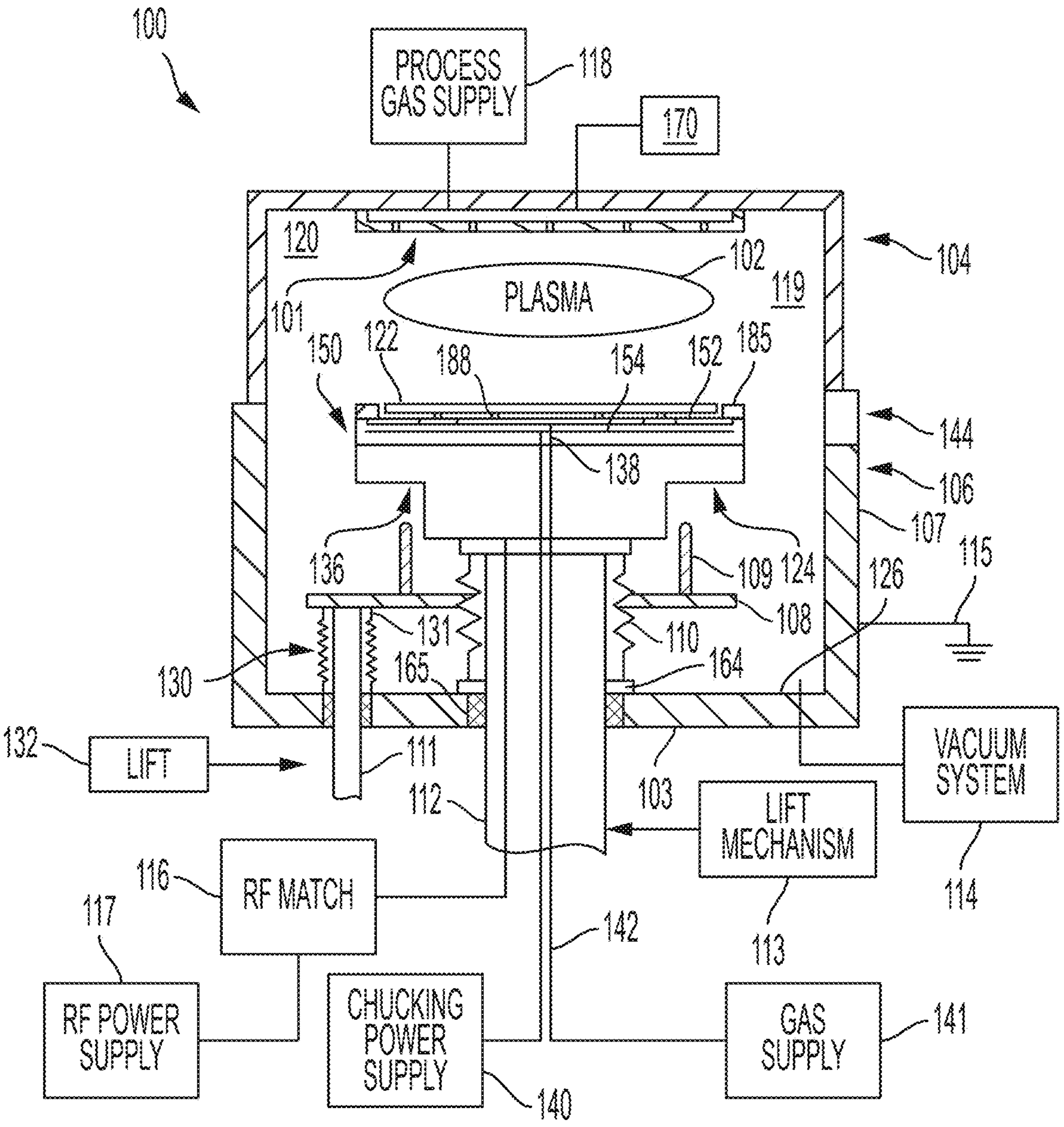
FIG. 1 depicts a schematic cross-sectional side view of a process chamber having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate supports for use in process chambers are provided herein. The substrate supports provided herein generally comprise an electrostatic chuck (ESC) having one or more chucking electrodes embedded therein, a plurality of mesas extending upward from an upper surface of the ESC, and a plurality of trenches extending downward from the upper surface. The ESC has a plurality of backside gas openings for cooling a substrate during processing. During the lifetime of the ESC, some or all of the plurality of mesas erode so that when a substrate is disposed on the substrate support, the substrate may block one or more of the backside gas openings. At least some of the plurality of backside gas openings terminate in the plurality of trenches to prevent blockage of backside gas flow when the plurality of mesas erode, thus advantageously extending the lifetime of the ESC.

FIG. 1 depicts a schematic cross-sectional side view of a process chamber having an electrostatic chuck in accordance with at least some embodiments of the present disclosure. In some embodiments, the process chamber 100 is an etch process chamber. In other embodiments, the process chamber 100 may be a deposition chamber, or any other suitable chamber for substrate processing that includes backside gas flow. The process chamber 100 may generally be a vacuum chamber that is suitably adapted to maintain sub-atmospheric pressures within an interior volume 120 during substrate processing. The process chamber 100 includes a chamber body 106 having a bottom plate 103, a lid 104, and sidewalls 107 extending from the bottom plate 103 to the lid 104. The chamber body 106 is made of a suitable material, for example, aluminum.

A substrate support 124 is disposed within the interior volume 120 to support and retain a substrate 122, such as a semiconductor wafer, for example, or other such substrate as may be retained. The substrate support 124 may generally comprise a pedestal 150 coupled to a hollow shaft 112. The pedestal 150 comprises an ESC 152 disposed on a base assembly 136. In some embodiments, the substrate support 124 may include an edge ring 185 disposed on the ESC 152. The ESC 152 may include one or more chucking electrodes 154 configured to electrostatically chuck the substrate 122 to the ESC 152. The one or more chucking electrodes 154 may also electrostatically chuck the edge ring 185 to the ESC 152. In some embodiments, the ESC 152 is made of a ceramic material, for example aluminum oxide ($Al_2O_3$).

The hollow shaft 112 provides a conduit to provide, for example, backside gases, process gases, fluids, coolants, power, or the like, to the pedestal 150. In some embodiments, the hollow shaft 112 is coupled to a lift mechanism 113, such as an actuator or motor, which provides vertical movement of the pedestal 150 between an upper, processing position and a lower, transfer position. A bellows assembly 110 is disposed about the hollow shaft 112 and is coupled between the pedestal 150 and a bottom surface 126 of the process chamber 100 to provide a flexible seal that allows vertical motion of the pedestal 150 while preventing loss of vacuum from within the process chamber 100. The bellows assembly 110 also includes a lower bellows flange 164 in contact with an o-ring 165 or other suitable sealing element which contacts the bottom surface 126 to help prevent loss of chamber vacuum.

In some embodiments, a showerhead 101 is disposed in the interior volume 120 proximate the lid 104 and opposite the substrate support 124 for delivering process gases into the interior volume 120. The process chamber 100 is coupled to and in fluid communication with a process gas supply 118 which may supply one or more process gases to the process chamber 100 for processing the substrate 122. The interior volume 120 may include a processing volume 119 located in the upper half of the interior volume 120 and generally between the substrate support 124 and the showerhead 101. The process chamber 100 may also include one or more shields (not shown) circumscribing various chamber components to prevent unwanted reaction between such components and ionized process material. The chamber body 106 may be made of metal, such as aluminum. The chamber body 106 may be grounded via a coupling to ground 115.

In some embodiments, the hollow shaft 112 facilitates coupling a backside gas supply 141, a chucking power supply 140, and RF power sources (e.g., RF plasma power supply 170 and a bias power supply 117) to the pedestal 150. In some embodiments, the bias power supply 117 includes one or more RF bias power sources. In some embodiments, RF energy supplied by the RF plasma power supply 170 may have a frequency of about 400 kHz to over 40 MHz. The backside gas supply 141 is disposed outside of the chamber body 106 and supplies heat transfer gas to the pedestal 150. In some embodiments, a RF plasma power supply 170 and a bias power supply 117 are coupled to the pedestal 150 via respective RF match networks (only RF match network 116 shown). In some embodiments, the substrate support 124 may alternatively include AC, DC, or RF bias power. In some embodiments, the AC, DC, or RF bias power may be pulsed.

The process chamber 100 may include a second lift 130. The second lift 130 can include a plurality of lift pins 109 mounted on a platform 108 connected to a shaft 111 which is coupled to a second lift mechanism 132 for raising and lowering the second lift 130. The plurality of lift pins 109 may extend through the ESC 152 so that the substrate 122 may be placed on or removed from the pedestal 150. In some embodiments, each of the lift pins 109 are not mounted to a common platform and are independently controllable. The pedestal 150 may include through holes to receive one or more of the lift pins 109. A bellows assembly 131 is coupled between the second lift 130 and bottom surface 126 to provide a flexible seal which maintains the chamber vacuum during vertical motion of the second lift 130. In some embodiments, as shown in FIG. 1, the second lift 130 is disposed outside of the hollow shaft 112.

The pedestal 150 includes gas distribution channels 138 extending, for example, from a lower surface of the pedestal 150 (e.g., bottom surface of the base assembly 136) to various openings in an upper surface of the pedestal 150. The gas distribution channels 138 are configured to provide backside gas, such as nitrogen (N) or helium (He), to the upper surface of the pedestal 150 to act as a heat transfer medium. The gas distribution channels 138 are in fluid communication with the backside gas supply 141 via gas conduit 142 to control the temperature and/or temperature profile of the pedestal 150 during use. The ESC 152 includes a plurality of mesas 188 extending from an upper surface of the ESC 152 configured to elevate the substrate 122 slightly above the upper surface to reduce heat transfer between the ESC 152 and the substrate 122 and disperse the backside gas in a more uniform manner. In some embodiments, the gas distribution channels 138 are configured to provide gas pressure for heat transfer and temperature control of the edge ring 185 independently from a temperature of the ESC 152. In some embodiments, the gas distribution channels 138 extend through the ESC 152 along two or more rings (see FIG. 3).

The process chamber 100 is coupled to and in fluid communication with a vacuum system 114 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 includes a slit valve 144 having a substrate transfer opening that is selectively opened or closed to facilitate transferring the substrate 122 into and out of the interior volume 120. In some embodiments, a transfer robot (not shown) having one or more transfer blades is configured to transfer the substrate 122.

In operation, for example, a plasma 102 may be created in the interior volume 120 to perform one or more processes. The plasma 102 may be created by coupling power from a plasma power source (e.g., RF plasma power supply 170) to a process gas via one or more electrodes near or within the interior volume 120 to ignite the process gas and creating the plasma 102. A bias power may be provided from a bias power supply (e.g., bias power supply 117) to the pedestal 150 to attract ions from the plasma 102 towards the substrate 122. The bias power supply 117 may supply bias power to the edge ring 185 and the ESC 152. For example, the bias power supply 117 may comprise a single power supply that is shared by both the edge ring 185 and the ESC 152. Backside gas, or heat transfer gas, may be provided to the substrate 122 via gas conduit 142 to control the temperature and/or temperature profile of the pedestal 150 during use.

Figure 2:
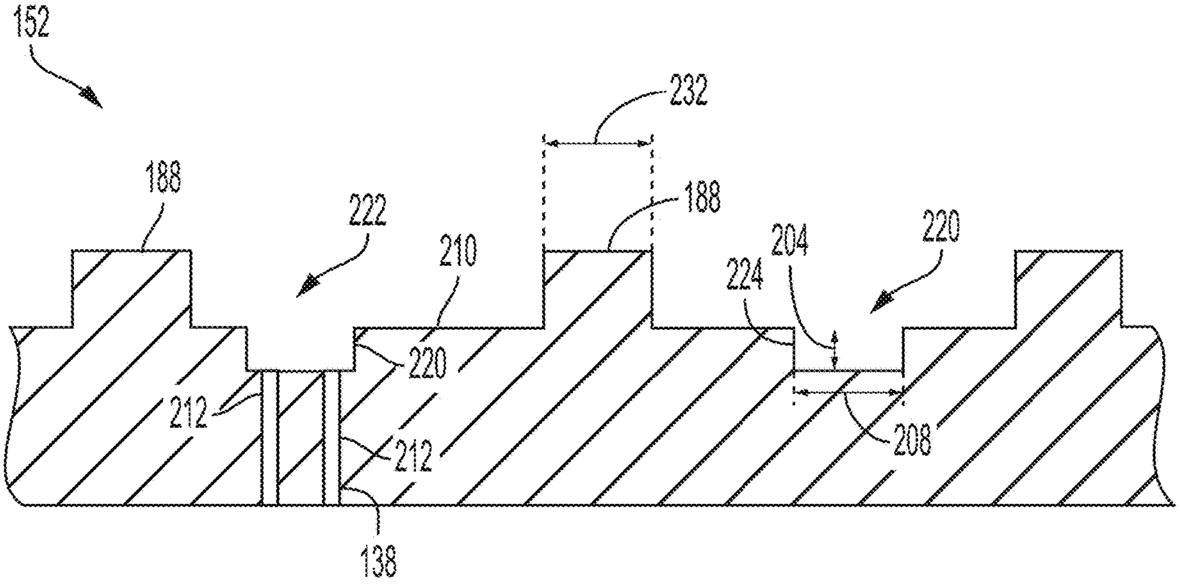
FIG. 2 depicts a close-up cross-sectional side view of a portion of an electrostatic chuck in accordance with at least some embodiments of the present disclosure.

FIG. 2 depicts a close-up cross-sectional side view of a ESC in accordance with at least some embodiments of the present disclosure. The plurality of mesas 188 extend upward from an upper surface 210 of the ESC 152. A plurality of trenches 220 extend downward from the upper surface 210 and into the ESC 152. The gas distribution channels 138 include a plurality of backside gas openings 212 extending through the ESC 152 and terminating within at least some of the plurality of trenches 220. For example, in some embodiments, the plurality of trenches 220 include first trenches 222 that are aligned with the plurality of backside gas openings 212 and second trenches 224 that are not aligned with the plurality of backside gas openings 212. In some embodiments, all of the plurality of backside gas openings 212 terminate at a location downward of the upper surface 210. In some embodiments, all of the plurality of backside gas openings 212 terminate in the plurality of trenches 220.

In some embodiments, the plurality of mesas 188 extend about 5 to about 20 microns upward from the upper surface 210. In some embodiments, the plurality of mesas 188 have a width of about 0.5 to about 3 millimeters. In some embodiments, a height of the plurality of mesas 188 is greater than or equal to a depth of the plurality of trenches 220. In some embodiments, the depth 204 of the plurality of trenches 220 is about 2 to about 20 microns. In some embodiments, a width 208 of the plurality of trenches 220 is about 2 to about 7 microns. One or more openings of the plurality of backside gas openings 212 may be disposed along a given cross-section of one of the plurality of trenches 220 (e.g., two backside gas openings 212 shown in FIG. 2).

Figure 3:
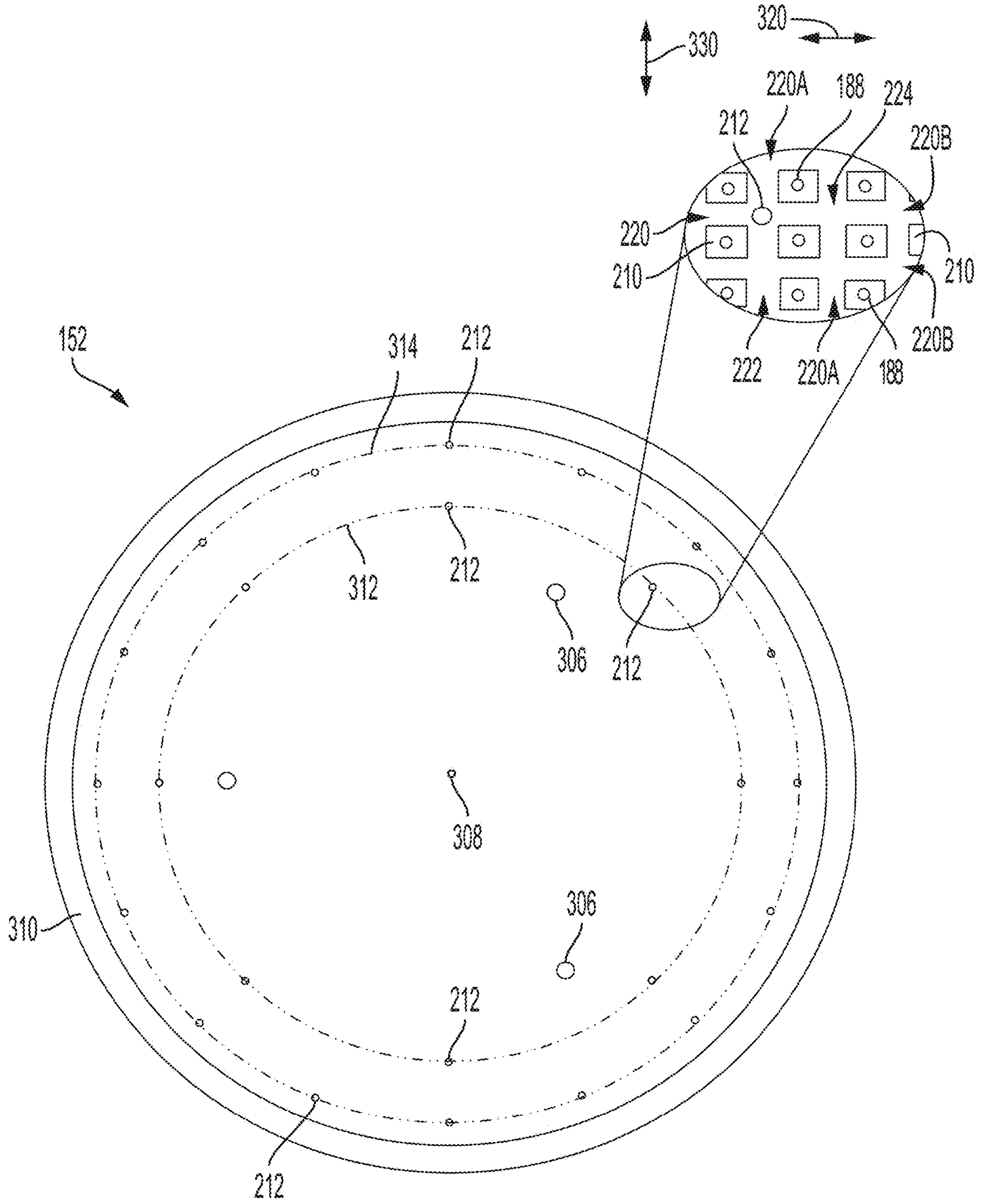
FIG. 3 depicts a schematic top view of an electrostatic chuck in accordance with at least some embodiments of the present disclosure.

FIG. 3 depicts a schematic top view of an ESC with an enlarged view of a portion of the ESC 152 in accordance with at least some embodiments of the present disclosure. The ESC 152 may generally be circular in shape. In some embodiments, the ESC 152 includes an upper peripheral notch 310. Is some embodiments, the edge ring 185 may rest on the upper peripheral notch 310. In some embodiments, the mesas of the plurality of mesas 188 have a circular shape when viewed from a top view of the ESC 152.

In some embodiments, the plurality of trenches 220 are linear and extend substantially across an entirety of the upper surface 210. However, in some embodiments, the plurality of trenches 220 may be other suitable shapes, such as curved or circular. In some embodiments, a first set of trenches 220A of the plurality of trenches 220 include trenches that extend parallel to each other in a first direction 330 and a second set of trenches 220B of the plurality of trenches 220 include trenches that extend parallel to each other in a second direction 320 different than the first direction 330. In some embodiments, the first direction 330 is orthogonal to the second direction 320 such that the plurality of trenches 220 are arranged in an orthogonal grid.

The plurality of backside gas openings 212 may be disposed along one or more annular rings. In some embodiments, the plurality of backside gas openings 212 are arranged along two or more rings, for example, an inner ring 312 and an outer ring 314. In some embodiments, the plurality of backside gas openings 212 are disposed at regular intervals about a central axis 308 of the ESC 152. In some embodiments, there are more second trenches 224 than first trenches 222 (i.e., more trenches not having backside gas openings 212 terminating in the trench than trenches having backside gas openings 212 terminating in the trench). In some embodiments, one or more of the plurality of backside gas openings 212 lie, or terminate, at an intersection of one of the first set of trenches 220A and one of the second set of trenches 220B, as depicted in the enlarged view of FIG. 3. In some embodiments, one or more of the plurality of backside gas openings 212 lie, or terminate, at only one of the first set of trenches 220A or the second set of trenches 220B. In some embodiments, one or more of the plurality of backside gas openings 212 terminate at the upper surface 210 and not in the plurality of trenches 220. In some embodiments, the plurality of backside gas openings 212 terminate in a combination of at an intersection of one of the first set of trenches 220A and one of the second set of trenches 220B, at only one of the first set of trenches 220A or the second set of trenches 220B, and the upper surface 210.

In some embodiments, the ESC 152 includes a plurality of lift pin openings 306. In some embodiments, the plurality of lift pin openings 306 are disposed radially inward of the two or more rings. In some embodiments, the plurality of trenches 220 extend adjacent to all of the plurality of mesas 188.

While the foregoing is directed to embodiments of the present disclosure, other and further embodiments of the disclosure may be devised without departing from the basic scope thereof.

The invention claimed is:

1. A substrate support, comprising:

an electrostatic chuck (ESC) having an upper surface and a plurality of mesas extending upward from the upper surface and a plurality of trenches extending downward from the upper surface and into the ESC, wherein each trench of the plurality of trenches extends in a linear manner across the upper surface, wherein the ESC includes a plurality of backside gas openings extending through the ESC and terminating within at least some of the plurality of trenches, and wherein each mesa of the plurality of mesas includes a trench of the plurality of trenches extending adjacent thereto; and one or more chucking electrodes disposed in the ESC.

2. The substrate support of claim 1, wherein the plurality of trenches form an orthogonal grid.

3. The substrate support of claim 1, wherein the plurality of trenches include first trenches that are aligned with the plurality of backside gas openings and second trenches that are not aligned with the plurality of backside gas openings.

4. The substrate support of claim 1, wherein a first set of the plurality of trenches extend parallel to each other in a first direction and a second set of the plurality of trenches extend parallel to each other in a second direction different than the first direction and intersect with the first set of the plurality of trenches.

5. The substrate support of claim 1, wherein the mesas are circular.

6. The substrate support of claim 1, wherein a depth of each of the plurality of trenches is 2 to 20 microns, wherein depth refers to a distance between the upper surface of the ESC and a lower surface of the plurality of trenches.

7. The substrate support of claim 1, wherein a width of each of the plurality of trenches is 2 to 7 microns.

8. The substrate support of claim 1, wherein the plurality of backside gas openings are arranged along an inner ring and an outer ring.

9. A substrate support, comprising:

an electrostatic chuck (ESC) having an upper surface and a plurality of mesas extending upward from the upper surface and a plurality of trenches extending downward from the upper surface and into the ESC, wherein the plurality of trenches extend in a linear manner across the upper surface in multiple directions to form an orthogonal grid, wherein the ESC includes a plurality of backside gas openings extending through the ESC along two or more rings and terminating within at least some of the plurality of trenches; and one or more chucking electrodes disposed in the ESC.

10. The substrate support of claim 9, wherein the plurality of trenches include a first set of parallel trenches and a second set of parallel trenches together arranged to form the orthogonal grid.

11. The substrate support of claim 9, wherein the ESC includes an upper peripheral notch.

12. The substrate support of claim 9, wherein the ESC includes a plurality of lift pin openings.

13. The substrate support of claim 12, wherein the plurality of lift pin openings are disposed radially inward of the two or more rings.

14. The substrate support of claim 9, wherein the plurality of trenches include first trenches that are aligned with the plurality of backside gas openings and second trenches that are not aligned with the plurality of backside gas openings, and wherein there are more second trenches than first trenches.

15. A process chamber, comprising:

a chamber body defining an interior volume therein; and a substrate support disposed in the interior volume, the substrate support comprising:

an electrostatic chuck (ESC) having an upper surface and a plurality of mesas extending upward from the upper surface and a plurality of trenches extending downward from the upper surface and into the ESC, wherein each trench of the plurality of trenches extends in a linear manner across the upper surface, wherein the ESC includes a plurality of backside gas openings extending through the ESC and terminating within at least some of the plurality of trenches, wherein each mesa of the plurality of mesas includes a trench of the plurality of trenches extending adjacent thereto, and one or more chucking electrodes disposed in the ESC.

16. The process chamber of claim 15, further comprising an RF power source coupled to a lid of the chamber body.

17. The process chamber of claim 15, further comprising a backside gas supply coupled to the plurality of backside gas openings.

18. The process chamber of claim 15, wherein the mesas have a circular shape, and wherein the plurality of trenches extend adjacent to all of the plurality of mesas.

19. The process chamber of claim 15, further comprising a lift mechanism having a plurality of lift pins configured to extend through the ESC.

* * * * *